(12) United States Patent
Chang et al.

(10) Patent No.: US 7,821,284 B2
(45) Date of Patent: Oct. 26, 2010

(54) SEMICONDUCTOR TEST HEAD APPARATUS USING FIELD PROGRAMMABLE GATE ARRAY

(75) Inventors: Kyunghun Chang, Yongin (KR); Chulki Jang, Icheon (KR); Mangil Kang, Yongin (KR); Sekyung Oh, Seongnam (KR)

(73) Assignee: IT&T, Suwon (KR)

( * ) Notice: Subject to any disclaimer, the term of this patent is extended or adjusted under 35 U.S.C. 154(b) by 131 days.

(21) Appl. No.: 12/257,411

(22) Filed: Oct. 24, 2008

(65) Prior Publication Data

US 2010/0102843 A1 Apr. 29, 2010

(51) Int. Cl.
*G01R 31/26* (2006.01)
(52) U.S. Cl. .................... 324/765; 324/158.1
(58) Field of Classification Search ........ None
See application file for complete search history.

(56) References Cited

U.S. PATENT DOCUMENTS 6,255,843 B1 * 7/2001 Kurihara .................... 324/765
6,631,340 B2 * 10/2003 Sugamori et al. ........... 702/122
7,356,435 B2 * 4/2008 Sato et al. ................... 702/118

* cited by examiner

*Primary Examiner*—Vinh P Nguyen
(74) *Attorney, Agent, or Firm*—NSIP Law

(57) ABSTRACT

A semiconductor test head apparatus using a field programmable gate array (FPGA) is disclosed. A semiconductor test head apparatus using a field programmable gate array, includes a pattern generator for generating a predetermined memory test pattern, a driver/comparator unit comprising a first transceiver which performs a driver function capable of recording a memory test pattern generated from the pattern generator in a device under test and a comparator function capable of comparing a level of a signal read by the device under test with a predetermined high-level reference value, and a second transceiver which performs the driver function and a comparator function capable of comparing a level of a signal read by the device under test with a predetermined low-level reference value, and a connection unit for electrically connecting the first transceiver in parallel to the second transceiver, and connecting the first transceiver and the second transceiver to the device under test.

14 Claims, 8 Drawing Sheets

SEMICONDUCTOR TEST HEAD APPARATUS USING FIELD PROGRAMMABLE GATE ARRAY

TECHNICAL FIELD

The following description relates to a semiconductor test head apparatus, and more particularly, to a semiconductor test head apparatus based on a field programmable gate array (FPGA) in which driver—and comparator—chips connected to a plurality of semiconductor devices are integrated, such that it is able to test a large number of semiconductor devices.

BACKGROUND

Generally, a semiconductor device (also called a device) manufactured by a predetermined assembly process of a semiconductor fabrication process experiences a test process for determining whether or not a specific function is finally carried out.

FIG. 1 is a perspective view illustrating a system for testing a semiconductor device. Referring to FIG. 1, the system for testing the semiconductor device includes a test head 2, a handler 3, and a HIFIX board 1. The test head 2 tests a semiconductor device. The handler 3 carries a predetermined number of semiconductor devices, performs a desired test on the semiconductor devices, classifies the semiconductor devices according to their grades, and loads the classified semiconductor devices thereon. The HIFIX board 1 is located between the test head 2 and the handler 3, such that it establishes an electrical connection between the semiconductor devices and the test head 2. In other words, where the semiconductor devices seated in an insert on a test tray are brought into contact with sockets of an (m×n) matrix on the HIFIX board 1 on the condition that the HIFIX board 1 having the sockets of the (m×n) matrix is matched with a test site of the handler 3, the semiconductor test system may simultaneously test (m×n) semiconductor devices.

FIG. 2 is a schematic diagram illustrating a connection structure between a test head and a HIFIX board of a semiconductor device test system. FIG. 3 is another schematic diagram illustrating a connection structure between a test head and a HIFIX board of a semiconductor device test system. Referring to FIGS. 2 and 3, a HIFIX board of a semiconductor device test system generally includes a socket board 10 and a bundle 20 of coaxial cables. In the above-mentioned structure, a test socket 12 in which a device under test (DUT) (i.e., a Ball Grid Array (BGA)—type DUT) 40 is inserted, is mounted on one side of the socket board 10. A HIFIX-board connector 14 connected to a relay connector 22 of the HIFIX board of the coaxial-cable bundle 20 for a relay purpose is mounted on the other side of the socket board 10. The coaxial-cable bundle 20 includes a relay-purposed coaxial cable 23, the first relay-purposed connector 22 of the HIFIX board, a second relay-purposed connector 24 of the test head, a first support frame 21 for supporting the first connector 22, and a second support frame 25 for supporting the second connector 24. In this case, the first connector 22 and the second connector 24 are installed on both sides of the relay-purposed coaxial cable 23, such that the first connector 22 is connected to the HIFIX-board connector 14 and the second connector 24 is connected to a test-head connector 35.

In the meantime, a test head device includes a test head substrate 30 and a variety of circuit elements loaded on one or both sides of the test head substrate 30. For example, the test head may include an algorithm pattern generator (ALPG) chip 31, a driver chip 32, a comparator chip 34, an interface chip 33, and the test head connector 35. The ALPG chip 31 may have unique characteristics which are classified according to individual semiconductor test system manufacturing companies. The driver chip 32 records a memory test pattern generated from the ALPG chip 31 in the DUT 40. The comparator chip 34 compares a level of the signal read by the DUT 40 with a predetermined reference value. The interface chip 33 controls a control computer (not shown) to interface with the ALPG chip 31. The test head connector 35 connects the second relay-purposed connector 24 of the test head to the test head substrate 30. Generally, the driver chip 32 or the comparator chip 34 may be implemented with a separate analog IC or ASIC. The reference number 36 is a control-purposed connection terminal for connecting the control computer to the test head substrate 30. The reference number 37 is a power-supply connection terminal.

FIG. 4 is a conceptual diagram illustrating a scheme for cooling a test head of a semiconductor device test system. As shown in FIG. 4, with reference to FIG. 2, in order to cool a test head, water or liquid cooled by a chiller 50 located outside of the semiconductor device test system encircles the surrounding of a test head substrate via pipes 52, such that the cooling of the test head may be carried out.

In the above-mentioned semiconductor test head, a driver chip or a comparator chip is implemented with an analog IC such that the size of the semiconductor test head is large and only one channel is assigned to a single IC. However, the above-mentioned semiconductor test head generally requires at least 30 channels to test only one DUT, and thus require several tens of driver chips and several tens of comparator chips according to the number of channels, such that it is difficult for the driver chips and the comparator chips to be physically mounted on one test head substrate. In addition, the above-mentioned semiconductor test head uses a large number of expensive analog ICs, such that the system including the test head becomes expensive. Furthermore, with the increasing demands of a handler capable of simultaneously handling a plurality of DUTs, a variety of improved handlers capable of simultaneously handling 512 DUTs have recently been developed and come into the market, such that a total of 15360 ICs (=30×512) are generally needed for a minimum of 30 channels on the condition that the minimum of 30 channels are used to test one DUT. As a result, a test head substrate has become be wider and longer, the complexity of mounting the individual ICs on the test head substrate has become higher, a higher-performance chiller has been needed, difficulty of pipe installation has increased, and a signal distortion (i.e., skew) among the ICs has become more serious.

SUMMARY

Accordingly, according to an aspect, there is provided a semiconductor test head apparatus using a field programmable gate array (FPGA).

According to another aspect, there is provided a semiconductor test head apparatus which integrates a plurality of driver chips and a plurality of comparator chips using an FPGA chip, and selectively performs a driver—or comparator—function in the FPGA chip without collision between the driver and comparator functions.

According to still another aspect, there is provided a semiconductor test head apparatus using a field programmable gate array, comprising a pattern generator for generating a predetermined memory test pattern, a driver/comparator unit comprising a first transceiver which performs a driver function capable of recording a memory test pattern generated from the pattern generator in a device under test and a comparator function capable of comparing a level of a signal read by the device under test with a predetermined high-level reference value, and a second transceiver which performs the driver function and a comparator function capable of comparing a level of a signal read by the device under test with a predetermined low-level reference value, and a connection unit for electrically connecting the first transceiver in parallel to the second transceiver, and connecting the first transceiver and the second transceiver to the device under test.

The apparatus may further comprise a controller for controlling the pattern generator so as to have the driver/comparator unit selectively perform the driver and comparator functions.

The pattern generator may be an algorithm pattern generator (ALPG) chip, and the driver/comparator unit may be a field programmable gate array (FPGA) chip.

The apparatus may further comprise a reference voltage provider for providing a reference voltage with respect to the level of the signal read by the device under test, and a controller for controlling the reference-voltage provider to apply the reference voltage to the connection unit, and controlling the pattern generator to prevent the memory test pattern from being applied to the driver/comparator unit.

The apparatus may further comprise a controller for controlling the pattern generator to enter different logic values in the first and second transceivers, such that the driver/comparator unit generates a reference voltage with respect to the level of the signal read by the device under test.

The connection unit may include impedance matching elements which are electrically connected in series to the first transceiver and the second transceiver, respectively.

The apparatus may further comprise a controller for controlling field programmable gate array-side impedance matching circuits respectively allocated to the first and second transceivers such that the driver/comparator unit generates a reference voltage with respect to the level of the signal read by the device under test, and controlling the pattern generator to prevent the memory test pattern from being applied to the driver/comparator unit.

According to still another aspect, there is provided a semiconductor test head apparatus using a field programmable gate array (FPGA), comprising an algorithm pattern generator (ALPG) chip for generating a predetermined memory test pattern, a field programmable gate array (FPGA) chip comprising a first transceiver which performs a driver function capable of recording a memory test pattern generated from the ALPG chip in a device under test (DUT), and performs a first comparator function capable of comparing a level of a signal read by the DUT with a predetermined high-level reference value, and a second transceiver which performs the driver function, and performs a second comparator function capable of comparing a level of a signal read by the DUT with a predetermined low-level reference value, a connection circuit for electrically connecting the first transceiver in parallel to the second transceiver, and connecting the first transceiver and the second transceiver to the DUT, and a test controller for controlling the ALPG chip such that the FPGA chip selectively performs the driver and comparator functions.

The apparatus may further comprise a reference voltage provider for providing a reference voltage with respect to the level of the signal read by the DUT, wherein in order to operate the FPGA chip as a comparator, the test controller may control the reference-voltage provider to apply the reference voltage to the connection circuit, and at the same time control the ALPG chip to prevent the memory test pattern from being applied to the FPGA chip.

In order to operate the FPGA chip as a comparator, the test controller may control the ALPG chip to enter different logic values in the first and second transceivers, such that the FPGA chip generates a reference voltage with respect to the level of the signal read by the DUT.

The connection circuit may include impedance matching elements which are electrically connected in series to the first transceiver and the second transceiver, respectively.

In order to operate the FPGA chip as a comparator, the test controller may control FPGA-side impedance matching circuits respectively allocated to the first and second transceivers such that the FPGA chip generates a reference voltage with respect to the level of the signal read by the DUT, and at the same time control the ALPG chip to prevent the memory test pattern from being applied to the FPGA chip.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, unless otherwise described, the same drawing reference numerals will be understood to refer to the same elements, features, and structures. The elements may be exaggerated for clarity and convenience.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

A semiconductor test head apparatus using an FPGA according to exemplary embodiments will hereinafter be described with reference to the annexed drawings.

Figure 1:
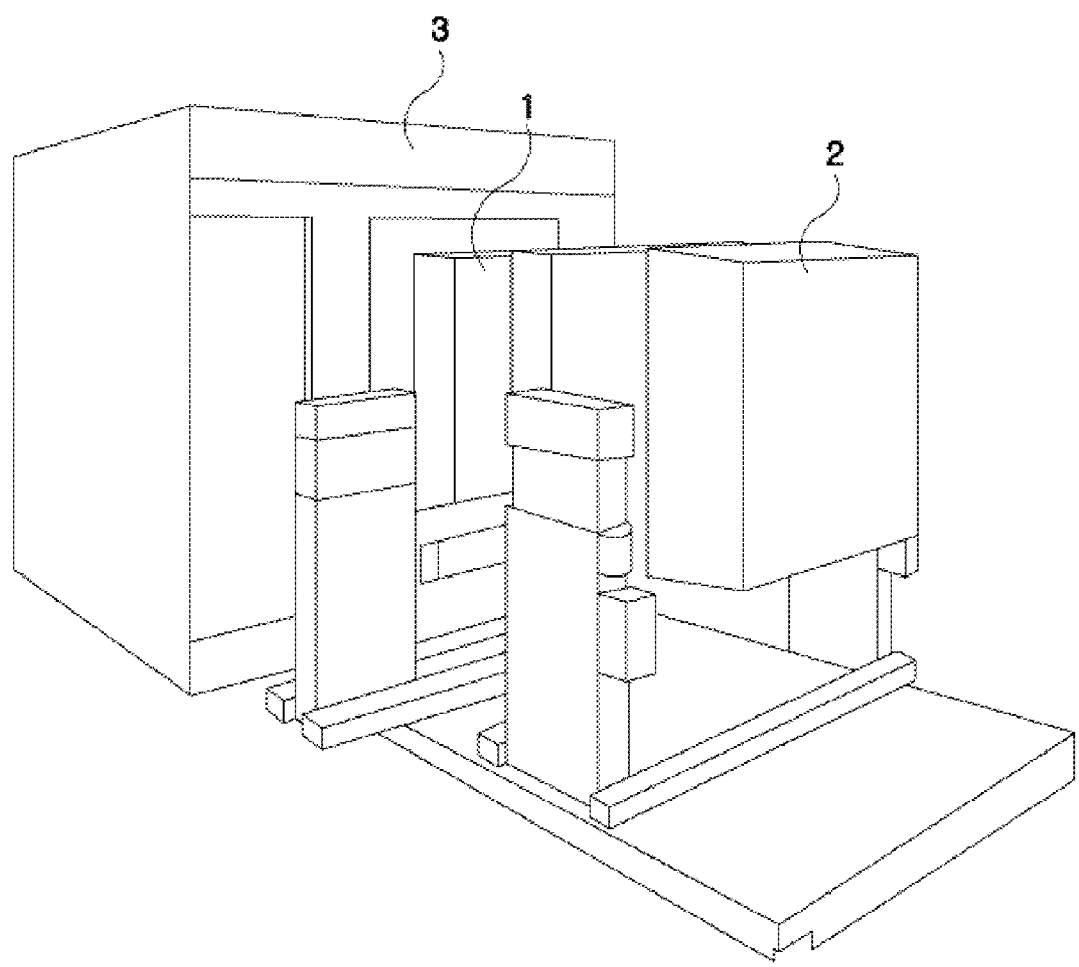
FIG. 1 is a perspective view illustrating a semiconductor device test system.
Figure 2:
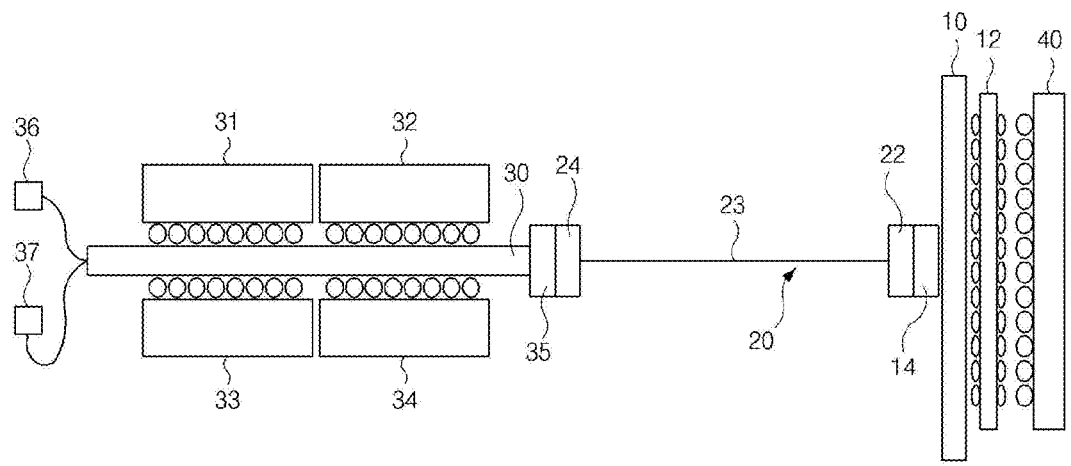
FIG. 2 is a schematic diagram illustrating a connection structure between a test head and a HIFIX board of a semiconductor device test system.
Figure 3:
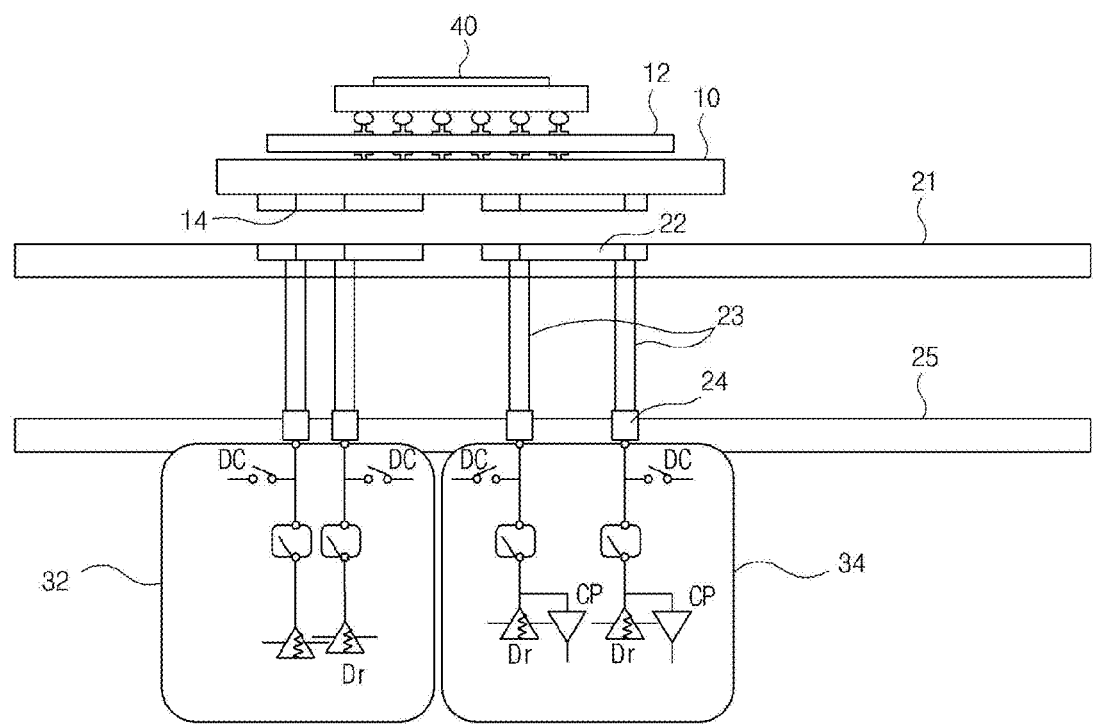
FIG. 3 is another schematic diagram illustrating a connection structure between a test head and a HIFIX board of a semiconductor device test system.
Figure 4:
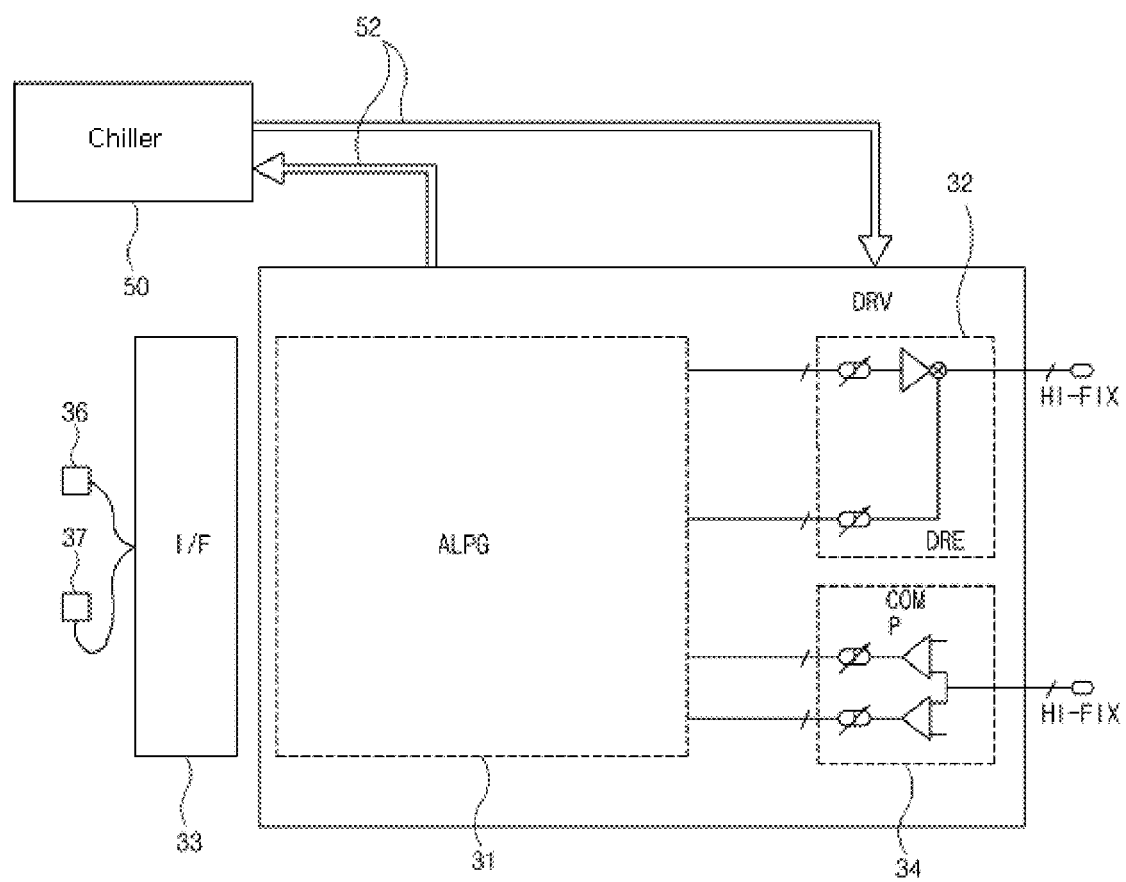
FIG. 4 is a conceptual diagram illustrating a test-head cooling scheme of a semiconductor device test system.
Figure 5:
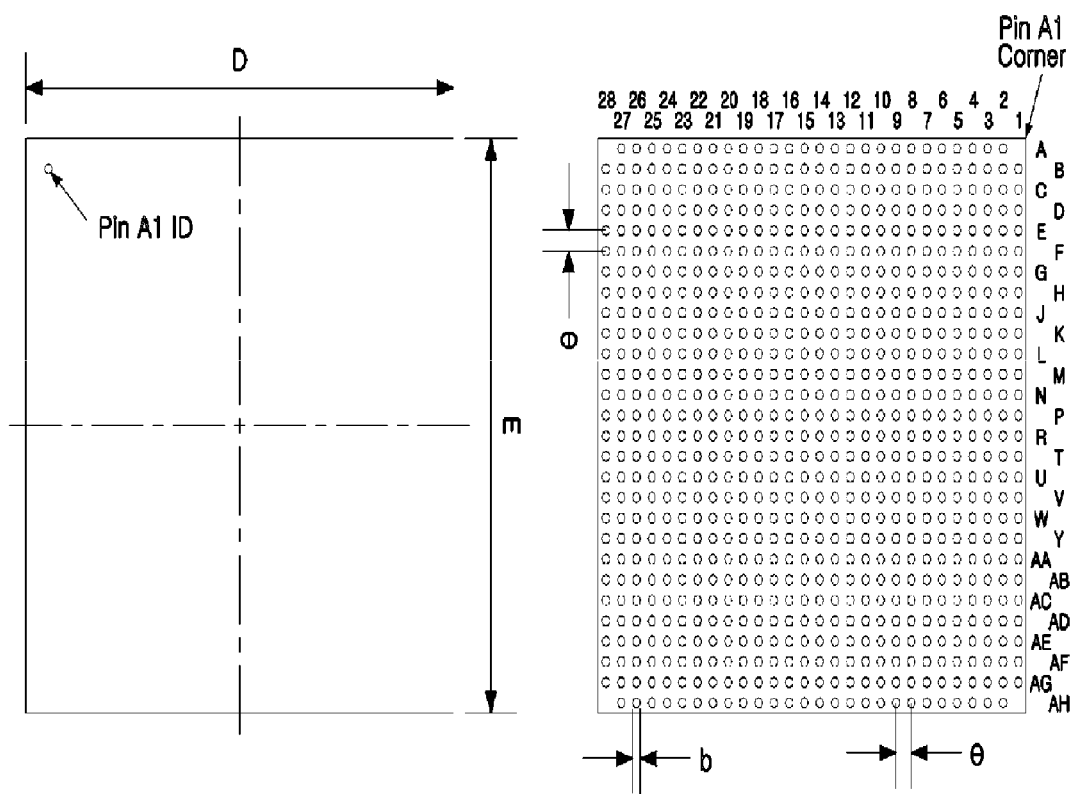
FIG. 5 is a diagram illustrating the appearance of an FPGA chip according to an exemplary embodiment.
Figure 5:
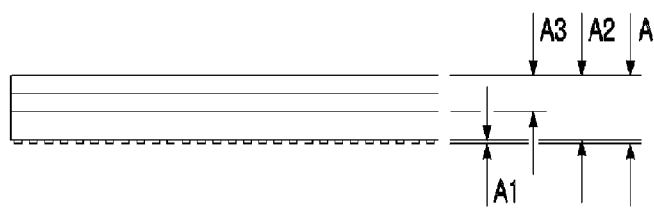
Figure 6:
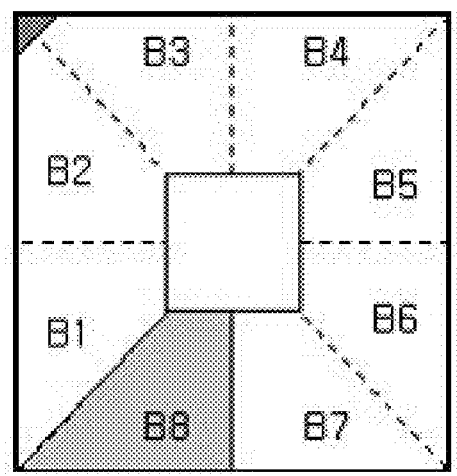
FIG. 6 is a diagram illustrating an input/output (I/O) bank structure of an FPGA chip according to an exemplary embodiment.

FIG. 5 illustrates the appearance of an FPGA chip according to an exemplary embodiment. FIG. 6 illustrates an input/ output (I/O) bank structure of an FPGA chip according to an exemplary embodiment. According to an exemplary embodiment, an FPGA may be formed of several tens of transceivers, each of which includes a transmitter and a receiver. The transceivers may be operated in the range from hundreds of Mbps to several Gbps. The FPGA may be implemented with the Stratix II GX product family (e.g., 780-Pin FineLine BGA chip of FIG. 5) of Altera Corporation. In this case, where the transceiver is applied to a semiconductor test head apparatus, a transmitter of the transceiver serves as a driver, and a receiver of the transceiver serves as a comparator. Referring to FIG. 6, the FPGA is segmented into a plurality of physical units (i.e., banks), such that a few transceivers or several tens of transceivers may be driven in each of the banks according to the product families.

Figure 7:
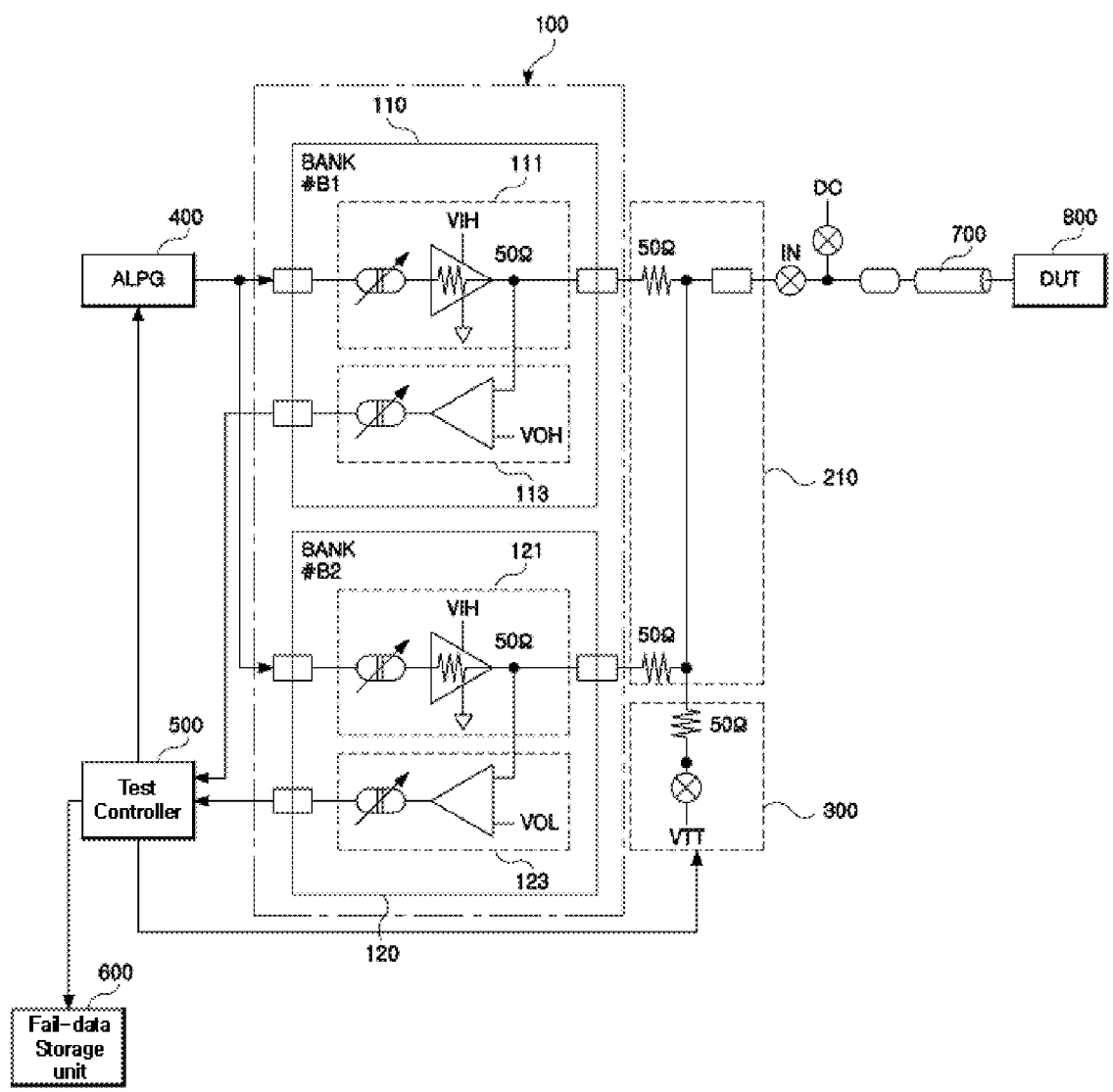
FIG. 7 is an electrical block diagram illustrating a semiconductor test head apparatus using an FPGA according to an exemplary embodiment.

FIG. 7 is an electrical block diagram illustrating a semiconductor test head apparatus using an FPGA according to an exemplary embodiment.

Referring to FIG. 7, the semiconductor test head apparatus comprises an ALPG chip 400, an FPGA chip 100, a connection circuit 210, a reference-voltage provider 300, a test controller 500, and a fail-data storage unit 600.

The ALPG chip 400 may have unique characteristics of individual semiconductor device test system manufacturing companies, and may generate a predetermined memory test pattern. The FPGA chip 100 comprises a first transceiver 110 and a second transceiver 120. The first transceiver 110 serves as the driver and comparator functions, and compares a level of the signal read by a DUT 800 with a predetermined high-level reference value ($V_{OH}$). The second transceiver 120 serves as the driver and comparator functions, and compares a level of the signal read by the DUT 800 with a predetermined low-level reference value ($V_{OL}$). The connection circuit 210 may electrically connect the first transceiver 110 and the second transceiver 120 in parallel to a cable 700 for connecting the DUT 800 to the FPGA chip 100, and may perform impedance matching between each of the first and second transceivers 110 and 120 and the cable 700. The reference-voltage provider 300 provides a reference voltage ($V_{TT}$) with respect to the signal received from the DUT 800. The test controller 500 may compare a logic value obtained by the execution result of the comparator function of the first or second transceiver 110 or 120 with a predetermined reference value. Where it is determined that the obtained logic value is equal to the predetermined reference value, the test controller 500 makes a PASS decision. Otherwise, where it is determined that the obtained logic value is different from the predetermined reference value, the test controller 500 makes a FAIL decision, such that it controls the ALPG chip 400 and the reference-voltage provider 300 according to the PASS or FAIL decision. The fail-data storage unit 600 may include data generated by the above-mentioned FAIL decision.

The reference numbers 111 and 113 may represent a first driver circuit and a high-level comparator circuit contained in the first transceiver 110, respectively. The reference numbers 121 and 123 may represent a second driver circuit and a low-level comparator circuit contained in the second transceiver 120.

In the above-mentioned configuration, the first transceiver 110, the second transceiver 120, and the connection circuit 210 may form a single input/output (I/O) channel, such that several tens of channels may be formed by one FPGA chip. For example, 1508-Pin FineLine BGA chip among the Stratix II GX product families of Altera Corporation may include 156 transceivers. Where two transceivers are connected in parallel to the above-mentioned parallel circuit 210, a total of 78 channels may be formed.

The connection circuit 210 may include a first impedance-matching element electrically connected in series to the first transceiver 110 and a second impedance-matching element electrically connected in series to the second transceiver 120. In this case, the impedance values of the impedance-matching elements may be adjusted according to the value of an internal impedance of the driver circuit. In other words, as shown in FIG. 7, provided that each of the first driver circuit 111 and the second driver circuit 121 has an internal impedance of 50Ω, and the cable 700 has the same internal impedance of 50Ω, each of the first and second transceivers 110 and 120 is connected in series to the above internal impedance value of 50Ω, such that impedance matching between the cable 700 and the FPGA chip 100 may be established.

The test controller 500 may control the ALPG chip 400 and the reference-voltage provider 300, such that the FPGA chip 100 may selectively perform the driver function or the comparator function. In more detail, where the test controller 500 desires to use the FPGA chip 100 as the driver, it controls the reference-voltage provider 300 to prevent the reference voltage ($V_{TT}$) from being applied to the connection circuit 210, and at the same time controls the ALPG chip 400 to apply a logic value '1' or '0' to each driver circuit 111 or 121. Therefore, where the logic value '1' is transferred from the ALPG chip 400 to each driver circuit 111 or 121, each driver circuit 111 or 121 outputs a predetermined high-level input voltage ($V_{IH}$) to the connection circuit 210. The connection circuit 210 outputs the $V_{IH}$ signal received from the FPGA chip 100 to the DUT 800. Likewise, where the other logic value '0' is transferred from the ALPG chip 400 to each driver circuit 111 or 121, each driver circuit 111 or 121 outputs a predetermined low-level input voltage ($V_{IH}$) to the connection circuit 210.

Where the test controller 500 desires to use the FPGA chip 100 as the comparator, it controls the reference-voltage provider 300 to apply the reference voltage ($V_{TT}$) to the connection circuit 210, and at the same time prevents a memory test pattern generated from the ALPG chip 400 from being applied to the FPGA chip 100. Therefore, a semiconductor-device read signal received from the DUT 800 via the connection circuit 210 is applied to a high-level comparator circuit 113 and a low-level comparator circuit 123. In this case, where the level of the above-mentioned read signal is denoted by $V_{dut}$, a signal denoted by 'VTT+Vdut' (hereinafter referred to as $V_{DUT}$) is applied to each of the comparator circuits 113 and 123. In this way, where the $V_{DUT}$ value applied to the high-level comparator circuit 113 is higher than a predetermined high-level output voltage ($V_{OH}$), the high-level comparator circuit 113 outputs a logic value of '1' (or '0'). Otherwise, where the $V_{DUT}$ value applied to the low-level comparator circuit 123 is lower than a predetermined low-level output voltage ($V_{OL}$), the low-level comparator circuit 113 outputs a logic value of '1' (or '0'). In the above-mentioned description, it should be noted that the $V_{TT}$ value is denoted by $V_{LL} < V_{TT} < V_{IH}$.

Figure 8:
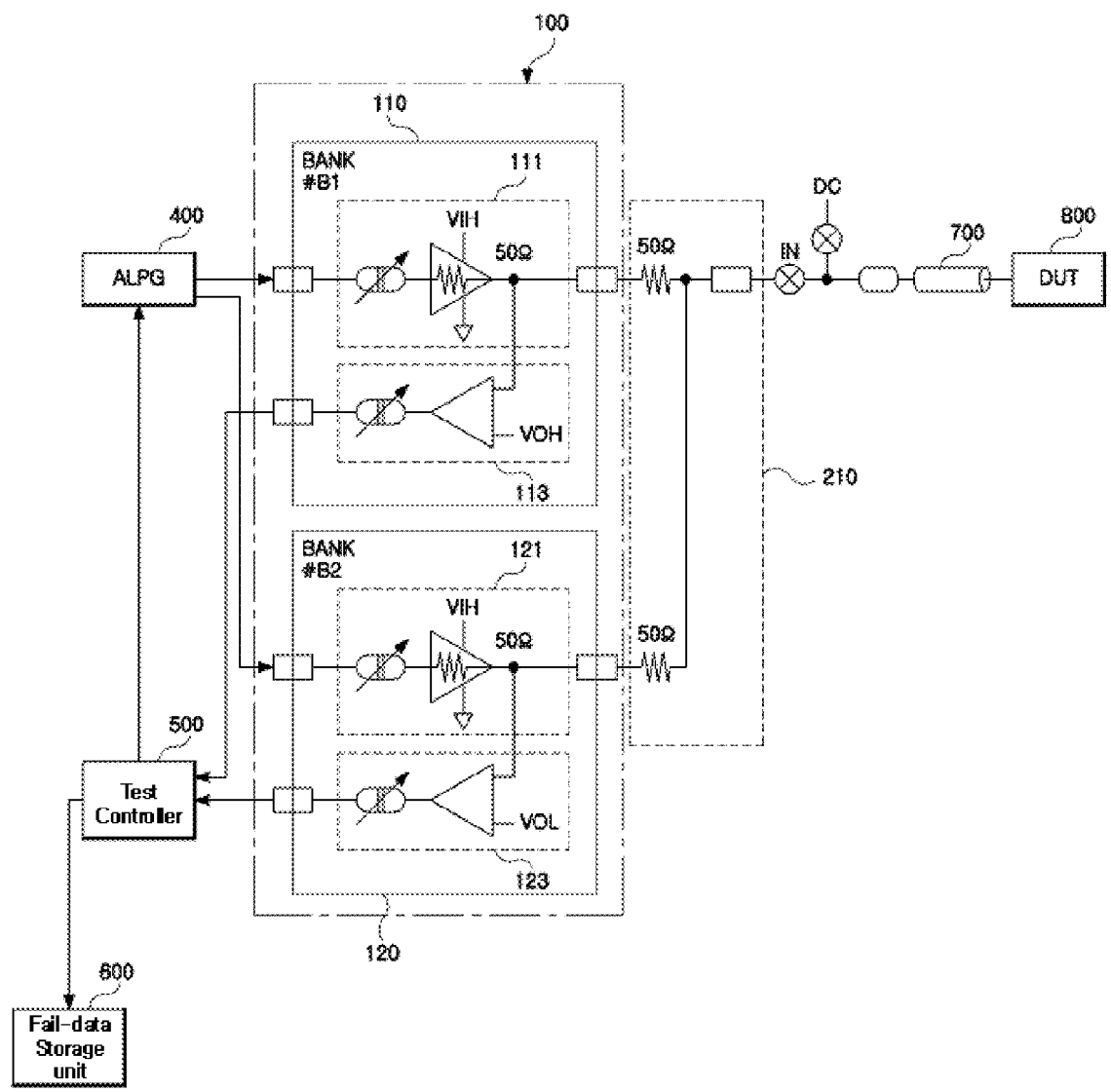
FIG. 8 is an electrical block diagram illustrating a semiconductor test head apparatus using an FPGA according to another exemplary embodiment.

FIG. 8 is an electrical block diagram illustrating a semiconductor test head apparatus using an FPGA according to another exemplary embodiment.

Referring to FIG. 8, the semiconductor test head apparatus comprises an ALPG chip 400, an FPGA chip 100, a test controller 500, and a fail-data storage unit 600. Compared with the semiconductor test head apparatus of FIG. 7, the semiconductor test head apparatus of FIG. 8 controls the ALPG chip 400 by means of the test controller 500 such that the reference voltage ($V_{TT}$) is applied to the connection circuit 210. That is, the test controller 500 of FIG. 8 controls the ALPG chip 400 such that the driver function or the comparator function may be selectively carried out by the FPGA chip 100. In this case, where the test controller 500 desires to use the FPGA chip 100 as the driver, it controls the ALPG chip 400 such that the logic value '1' or '0' is applied to the driver circuits 111 and 121 in the same manner as in FIG. 7. Otherwise, where the test controller 500 desires to use the FPGA chip 100 as the comparator, it controls the ALPG chip 400 instead of the reference-voltage provider 300, such that different logic values are applied to the driver circuits 111 and 121. That is, where the logic value of '1' is applied to the first driver circuit 111 and the other logic value of '0' is applied to the second driver circuit 121, the first driver circuit 111 has one potential of '$V_{OH}$' with respect to the connection circuit 210, and the second driver 121 has the other potential of '$V_{OL}$' with respect to the connection circuit 210. In case of using an equivalent circuit of the above-mentioned configuration, from the viewpoint of the FPGA chip 100 on the basis of the connection circuit 210, it can be recognized that a predetermined voltage of $(V_{IH}+V_{IL})/2$ (i.e., the voltage of $V_{TT}$) has occurred between the connection circuit 210 and the FPGA chip 100. Thus, where the FPGA chip 100 is used as the comparator upon receiving the read signal from the DUT 800, the $V_{DUT}$ value is applied to each of the comparator circuits 113 and 123. In this way, where the $V_{DUT}$ value applied to the high-level comparator circuit 113 is higher than a predetermined high-level output voltage $V_{OH}$, the high-level comparator circuit 113 outputs the logic value of '1' (or '0'). Otherwise, where the $V_{DUT}$ value applied to the low-level comparator circuit 123 is lower than a predetermined low-level output voltage $V_{OL}$, the low-level comparator circuit 113 outputs a logic value of '1' (or '0'). In the above-mentioned description, it should be noted that the $V_{TT}$ value is denoted by $(V_{IH}+V_{IL})/2=V_{TT}$.

Figure 9:
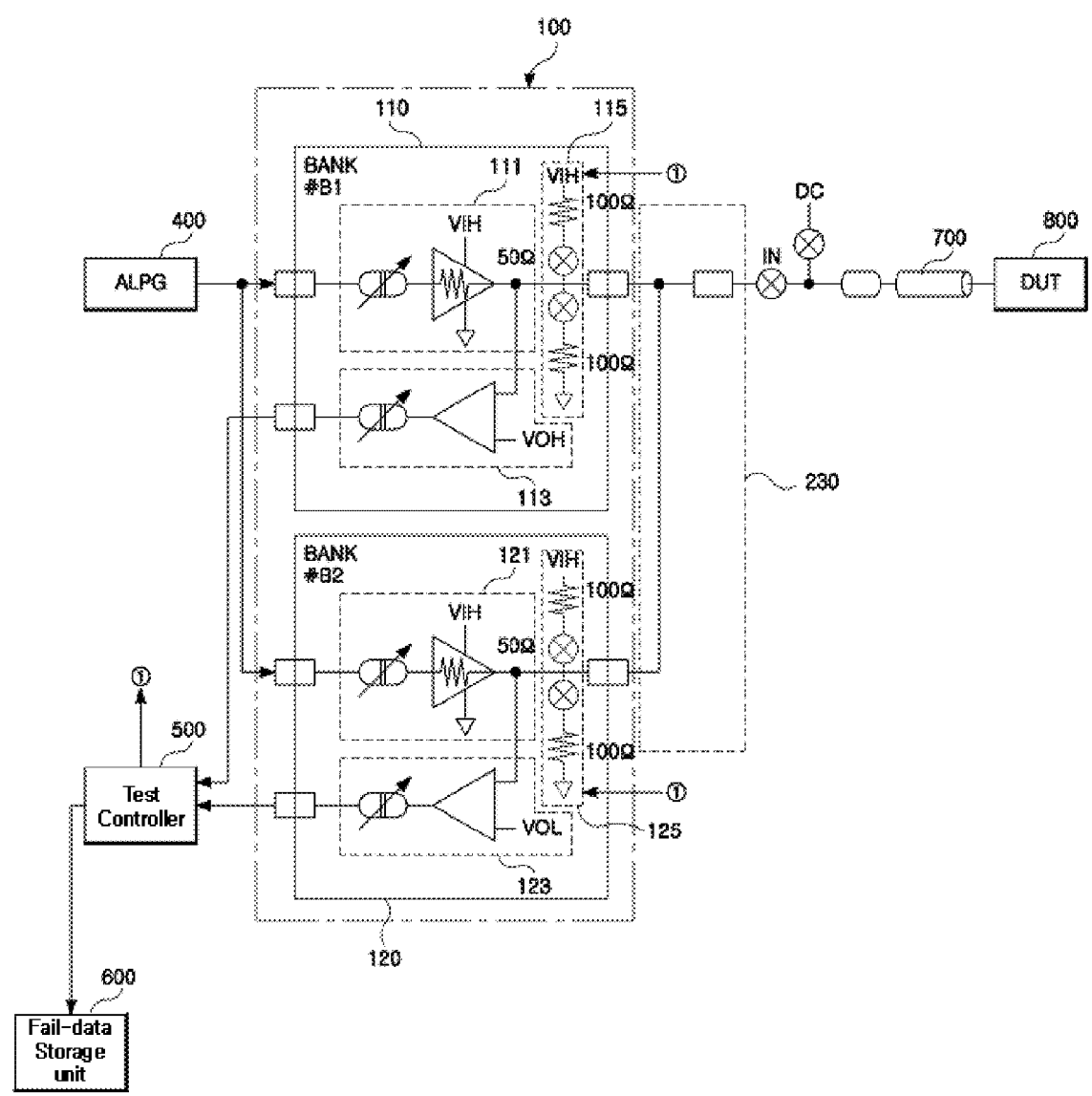
FIG. 9 is an electrical block diagram illustrating a semiconductor test head apparatus using an FPGA according to still another exemplary embodiment.

FIG. 9 is an electrical block diagram illustrating a semiconductor test head apparatus using an FPGA according to still another exemplary embodiment.

Referring to FIG. 9, the semiconductor test head apparatus comprises an ALPG chip 400, an FPGA chip 100, a test controller 500, and a fail-data storage unit 600. Compared with the semiconductor test head apparatuses of FIGS. 7 and 8, the test controller 500 contained in the semiconductor test head apparatus of FIG. 9 controls an FPGA-side impedance matching circuit (i.e., Digitally Controlled Impedance: DCI) 115 or 125 allocated to each transceiver, such that it outputs the reference voltage ($V_{TT}$) to the individual comparator circuits 113 and 123. In other words, the test controller 500 controls the ALPG chip 400 and the FPGA chip 100 such that the FPGA chip 100 may selectively perform the driver function or the comparator function. In this case, where the test controller 500 desires to use the FPGA chip 100 as the driver, it controls the ALPG chip 400 to prevent the high-level input voltage ($V_{IH}$) from being applied to the FPGA-side impedance matching circuit 115 or 125, and at the same time the logic value '1' or '0' may be equally applied to the individual driver circuits 111 and 121.

On the other hand, where the test controller 500 desires to use the FPGA chip as the comparator, it controls the ALPG chip 400, such that a memory test pattern generated from the ALPG chip 400 is not applied to the FPGA chip 100 and at the same time the high-level input voltage ($V_{IH}$) is applied to the impedance matching circuits 115 and 125. That is, where the $V_{IH}$ value is applied to the first FPGA-side impedance matching circuit 115, from the viewpoint of the first FPGA-side impedance matching circuit 115 on the basis of the high-level comparator circuit 113, it can be recognized that a predetermined voltage of $V_{IH}/2$ (i.e., the voltage of $V_{TT}$) has occurred between the high-level comparator circuit 113 and the first FPGA-side impedance matching circuit 115. Therefore, where the FPGA chip 100 is used as the comparator upon receiving the read signal from the DUT 800, the $V_{DUT}$ value is applied to the individual comparator circuits 113 and 123. In the above-mentioned description, it should be noted that the $V_{TT}$ value must be denoted by $(V_{IH})/2=V_{TT}$.

Compared to the semiconductor test head apparatuses of FIGS. 7 and 8, the semiconductor test head apparatus of FIG. 9 performs impedance matching between the FPGA chip 100 and the cable 700 by means of the above FPGA-side impedance matching circuits 115 and 125, such that the connection circuit 230 of FIG. 9 need not construct the impedance matching element differently from the above-mentioned connection circuit 210 of FIG. 7 or 8, by interconnecting the first transceiver 110, the second transceiver 120, and the cable 700 in parallel with one another.

According to certain embodiments described above, several tens of driver chips and several tens of comparator chips are replaced with a single FPGA chip, such that the number of necessary chips is greatly reduced. Accordingly, a heating value may be reduced. As a result, an FPGA chip of a semiconductor test head apparatus may be directly cooled by, for example, a cooling fan according to an air-cooling scheme in which air is firstly cooled and moisture is then removed from the cooled air by a dehydrator.

In a semiconductor test head apparatus using an FPGA according to an exemplary embodiment, two transceivers contained in the FPGA chip are electrically connected in parallel to each other, and are connected to a DUT, such that the driver function or the comparator function may be selectively carried out without collision between the driver and comparator functions. Accordingly, several tens of channels may be formed by only one FPGA chip. As a result, the size and costs of the semiconductor test head apparatus may be greatly reduced, and a signal distortion (i.e., skew) may also be reduced. Also, several tens of driver- and comparator-chips may be replaced with only one FPGA chip, such that the number of necessary chips is greatly reduced, resulting in the reduction of a heating value. Accordingly, a semiconductor test head apparatus according to an exemplary embodiment is able to select an air-cooled type structure to cool an FPGA chip of the semiconductor test head apparatus.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor test head apparatus using a field programmable gate array (FPGA), comprising:
   an algorithm pattern generator (ALPG) chip for generating a predetermined memory test pattern;
   a field programmable gate array (FPGA) chip comprising
      a first transceiver which performs a driver function capable of recording a memory test pattern generated from the ALPG chip in a device under test (DUT), and performs a first comparator function capable of comparing a level of a signal read by the DUT with a predetermined high-level reference value, and
      a second transceiver which performs the driver function, and performs a second comparator function capable of comparing a level of a signal read by the DUT with a predetermined low-level reference value;

a connection circuit for electrically connecting the first transceiver in parallel to the second transceiver, and connecting the first transceiver and the second transceiver to the DUT; and a test controller for controlling the ALPG chip such that the FPGA chip selectively performs the driver and comparator functions.

2. The apparatus according to claim 1, further comprising:

a reference voltage provider for providing a reference voltage with respect to the level of the signal read by the DUT, wherein in order to operate the FPGA chip as a comparator, the test controller controls the reference-voltage provider to apply the reference voltage to the connection circuit, and at the same time controls the ALPG chip to prevent the memory test pattern from being applied to the FPGA chip.

3. The apparatus according to claim 1, wherein:

in order to operate the FPGA chip as a comparator, the test controller controls the ALPG chip to enter different logic values in the first and second transceivers, such that the FPGA chip generates a reference voltage with respect to the level of the signal read by the DUT.

4. The apparatus according to claim 2, wherein the connection circuit includes impedance matching elements which are electrically connected in series to the first transceiver and the second transceiver, respectively.

5. The apparatus according to claim 3, wherein the connection circuit includes impedance matching elements which are electrically connected in series to the first transceiver and the second transceiver, respectively.

6. The apparatus according to claim 1, wherein:

in order to operate the FPGA chip as a comparator, the test controller controls FPGA-side impedance matching circuits respectively allocated to the first and second transceivers such that the FPGA chip generates a reference voltage with respect to the level of the signal read by the DUT, and at the same time controls the ALPG chip to prevent the memory test pattern from being applied to the FPGA chip.

7. A semiconductor test head apparatus using a field programmable gate array, comprising:

a pattern generator for generating a predetermined memory test pattern;

a driver/comparator unit comprising a first transceiver which performs a driver function capable of recording a memory test pattern generated from the pattern generator in a device under test and a comparator function capable of comparing a level of a signal read by the device under test with a predetermined high-level reference value, and a second transceiver which performs the driver function and a comparator function capable of comparing a level of a signal read by the device under test with a predetermined low-level reference value; and a connection unit for electrically connecting the first transceiver in parallel to the second transceiver, and connecting the first transceiver and the second transceiver to the device under test.

8. The apparatus according to claim 7, further comprising a controller for controlling the pattern generator so as to have the driver/comparator unit selectively perform the driver and comparator functions.

9. The apparatus according to claim 7, wherein:

the pattern generator is an algorithm pattern generator (ALPG) chip, and the driver/comparator unit is a field programmable gate array (FPGA) chip.

10. The apparatus according to claim 7, further comprising:

a reference voltage provider for providing a reference voltage with respect to the level of the signal read by the device under test; and a controller for controlling the reference-voltage provider to apply the reference voltage to the connection unit, and controlling the pattern generator to prevent the memory test pattern from being applied to the driver/comparator unit.

11. The apparatus according to claim 7, further comprising a controller for controlling the pattern generator to enter different logic values in the first and second transceivers, such that the driver/comparator unit generates a reference voltage with respect to the level of the signal read by the device under test.

12. The apparatus according to claim 10, wherein the connection unit includes impedance matching elements which are electrically connected in series to the first transceiver and the second transceiver, respectively.

13. The apparatus according to claim 11, wherein the connection unit includes impedance matching elements which are electrically connected in series to the first transceiver and the second transceiver, respectively.

14. The apparatus according to claim 7, further comprising a controller for controlling field programmable gate array-side impedance matching circuits respectively allocated to the first and second transceivers such that the driver/comparator unit generates a reference voltage with respect to the level of the signal read by the device under test, and controlling the pattern generator to prevent the memory test pattern from being applied to the driver/comparator unit.

* * * * *